(12) United States Patent  
Bolken et al.

(10) Patent No.: US 8,709,878 B2
(45) Date of Patent: Apr. 29, 2014

(54) METHODS OF PACKAGING IMAGER DEVICES AND OPTICS MODULES, AND RESULTING ASSEMBLIES

(75) Inventors: Todd Bolken, Star, ID (US); Scott Willmorth, Boise, ID (US); Bradley Bitz, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 114 days.

(21) Appl. No.: 13/367,213

(22) Filed: Feb. 6, 2012

(65) Prior Publication Data

US 2012/0135560 A1 May 31, 2012

Related U.S. Application Data

(62) Division of application No. 11/958,757, filed on Dec. 18, 2007, now Pat. No. 8,110,884.

(51) Int. Cl.
*H01L 21/00* (2006.01)

(52) U.S. Cl.
USPC ............ 438/127; 438/107; 438/113; 438/118; 438/119; 438/124; 257/432; 257/433; 257/444; 250/216; 250/239; 250/208.1; 250/227.11; 250/227.28; 359/363; 359/809; 385/88; 385/115

(58) Field of Classification Search
USPC ......... 438/107, 109, 110, 111, 112, 113, 116, 438/118, 119, 123, 124, 127, FOR. 367; 257/432, 433, 444; 250/239, 216, 250/208.1, 227.11, 227.28; 359/363, 809; 385/88, 115

See application file for complete search history.

(56) References Cited

U.S. PATENT DOCUMENTS

| | | | |
|---|---|---|---|
| 2,918,584 A | 12/1959 | Edsburg et al. | |
| 6,649,991 B1 * | 11/2003 | Chen et al. | 257/433 |
| 6,713,857 B1 * | 3/2004 | Tsai | 257/686 |
| 2006/0192230 A1 | 8/2006 | Wood et al. | |
| 2006/0278946 A1 | 12/2006 | Shiraishi et al. | |
| 2008/0017940 A1 | 1/2008 | Yang | |
| 2009/0152658 A1 | 6/2009 | Bolken et al. | |

* cited by examiner

*Primary Examiner* — Alexander Sofocleous
*Assistant Examiner* — Joannie A Garcia
(74) *Attorney, Agent, or Firm* — Perkins Coie LLP

(57) ABSTRACT

A method of packaging imager devices and optics modules is disclosed which includes positioning an imager device and an optics module in each of a plurality of openings in a carrier body, introducing an encapsulant material into each of the openings in the carrier body and cutting the carrier body to singulate the plurality of imager devices and optics modules into individual units, each of which comprise an imager device and an optics module. A device is also disclosed which includes an imager device comprising a plurality of photosensitive elements and an optics module coupled to the imager device, the optics module comprising at least one lens that, when the optics module is coupled to the imager device, is positioned a fixed, non-adjustable distance from the plurality of photosensitive elements.

13 Claims, 12 Drawing Sheets

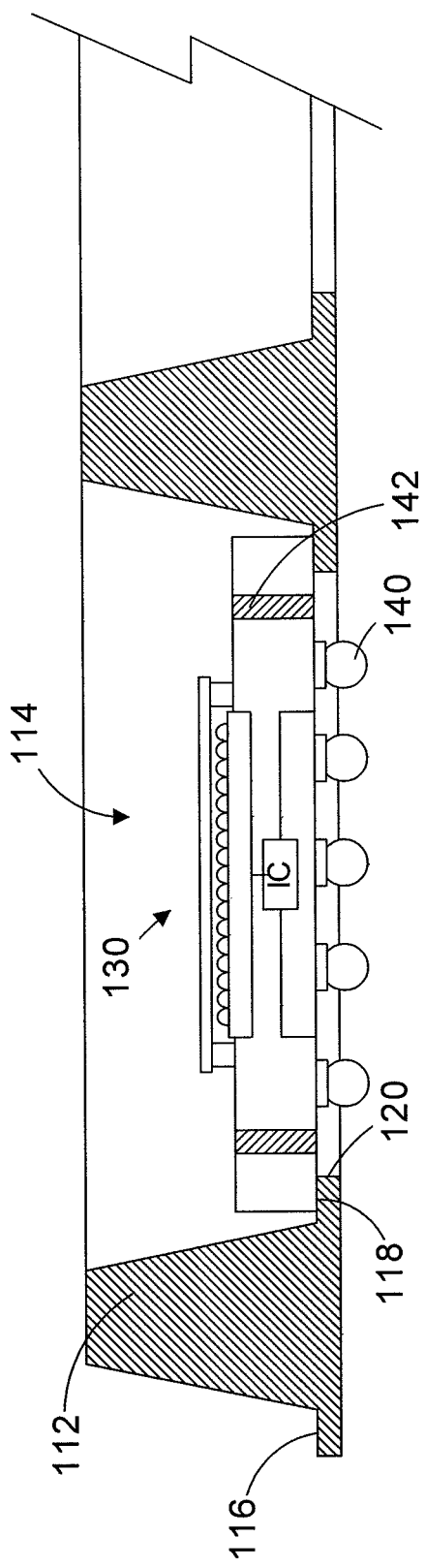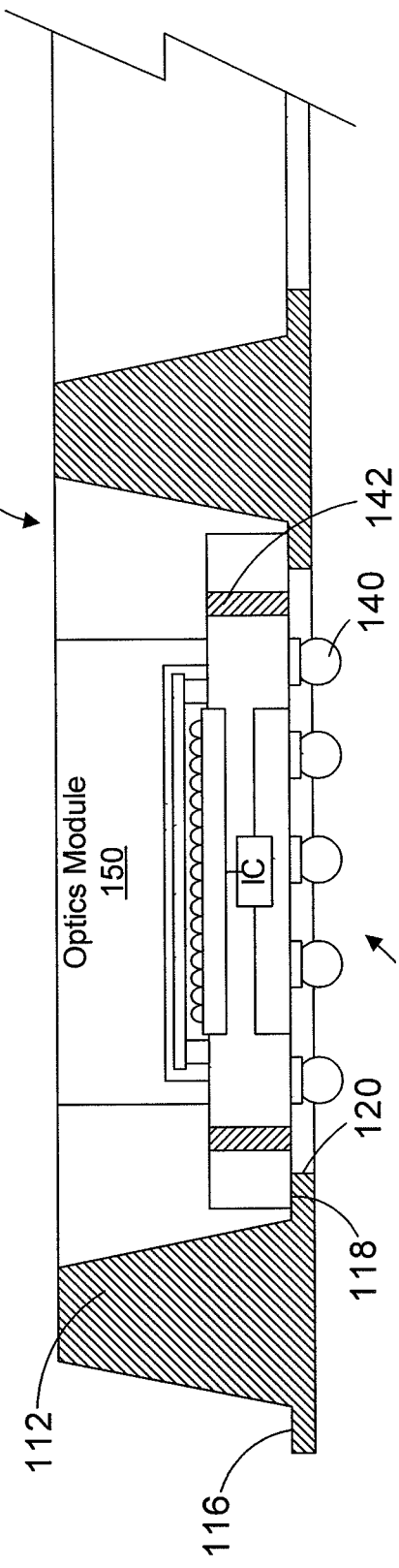

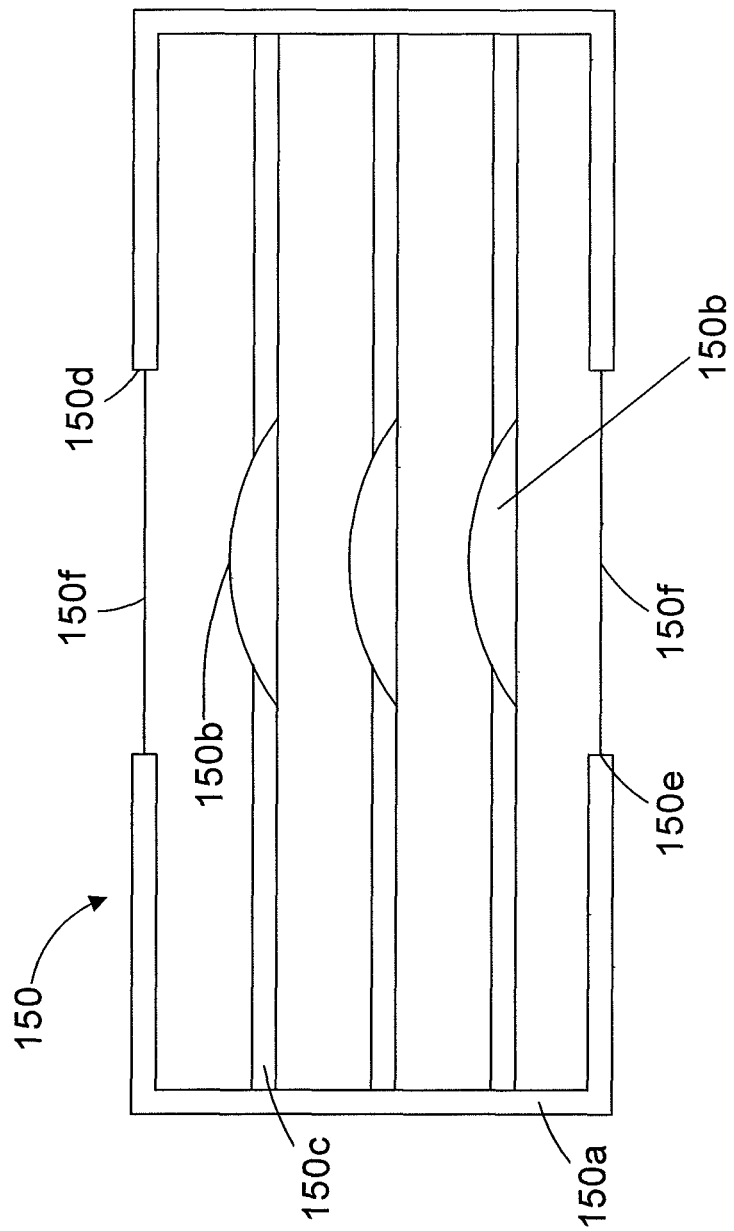

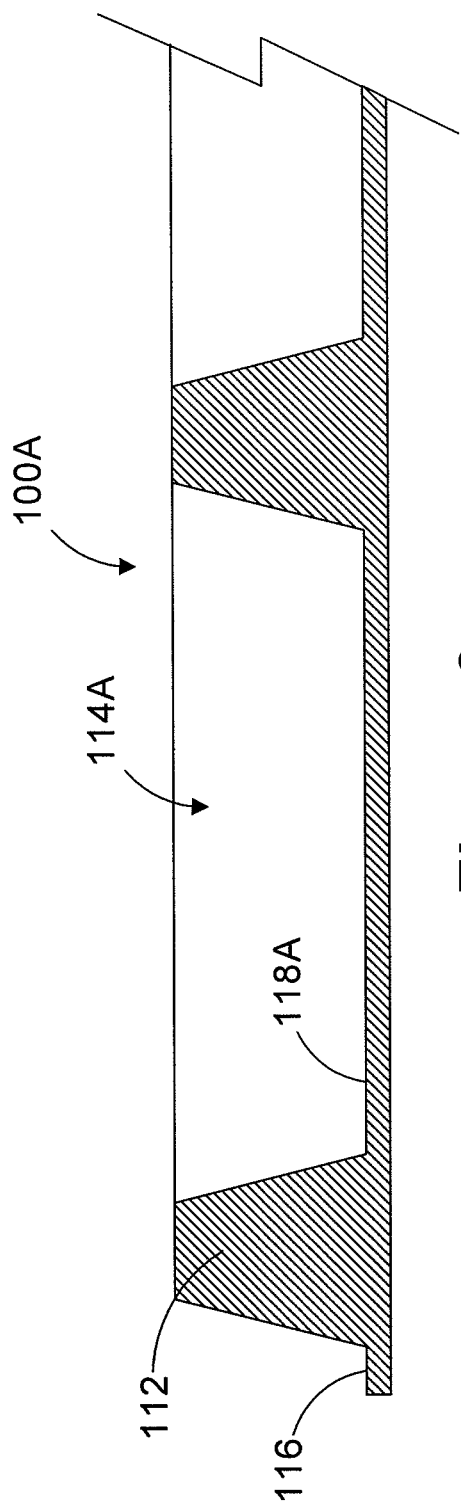

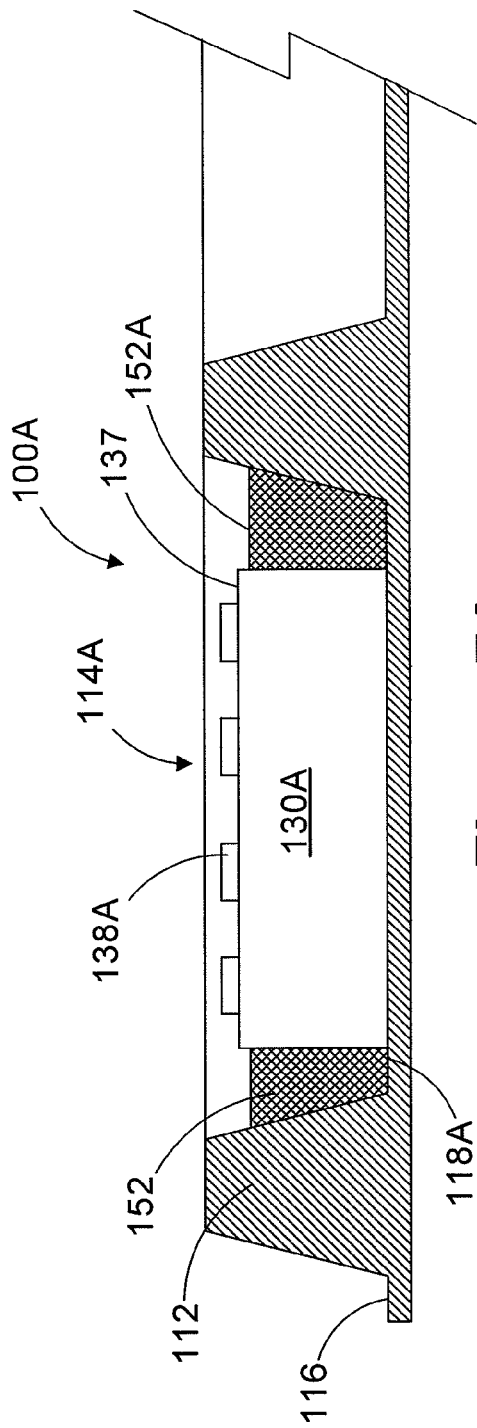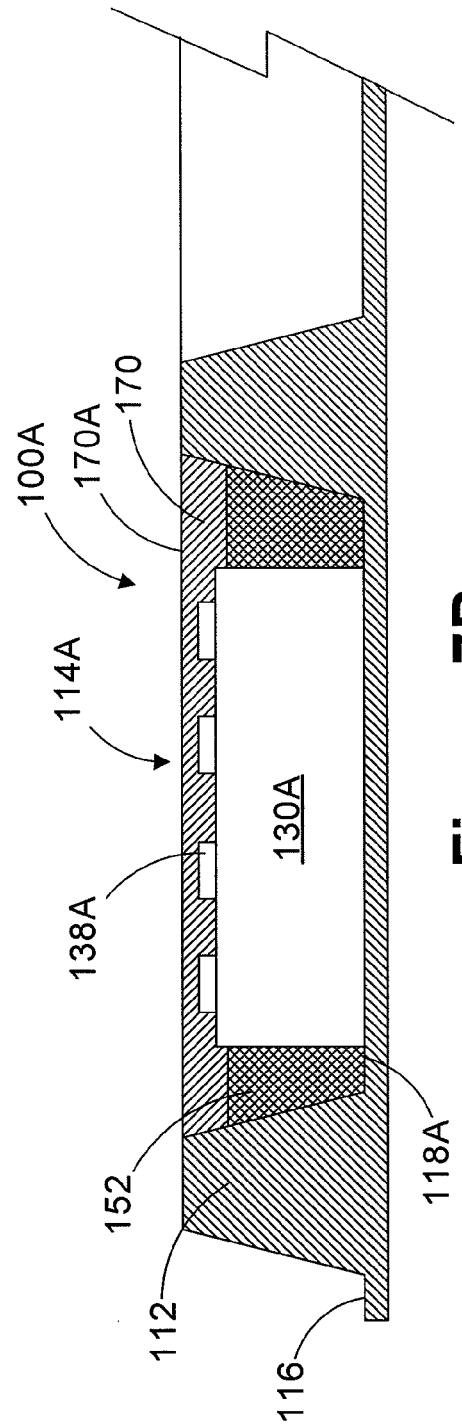

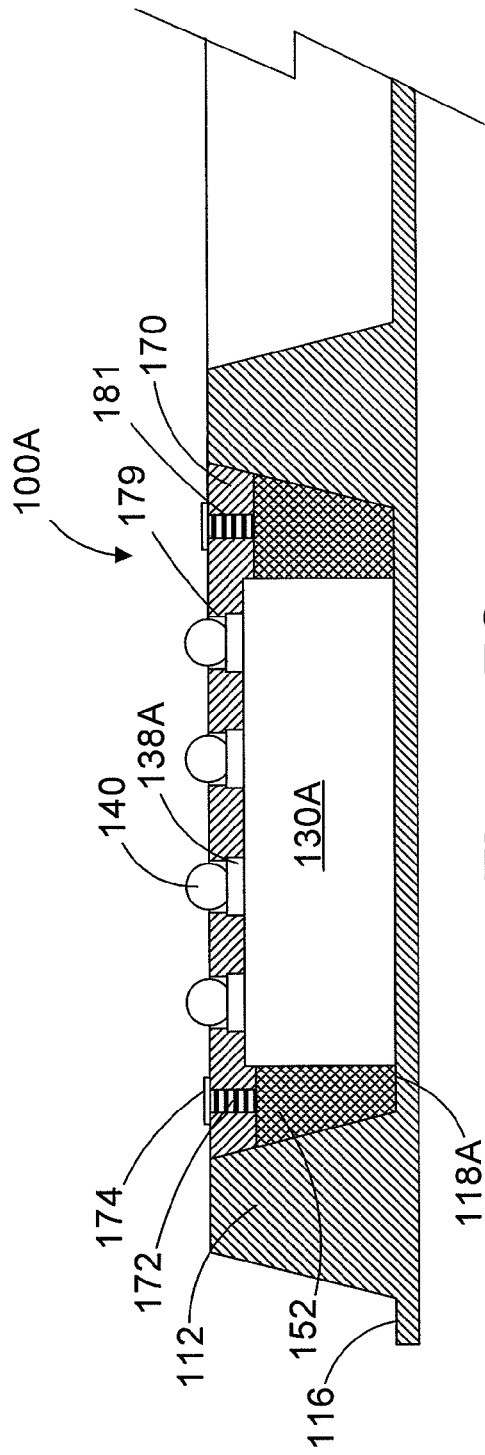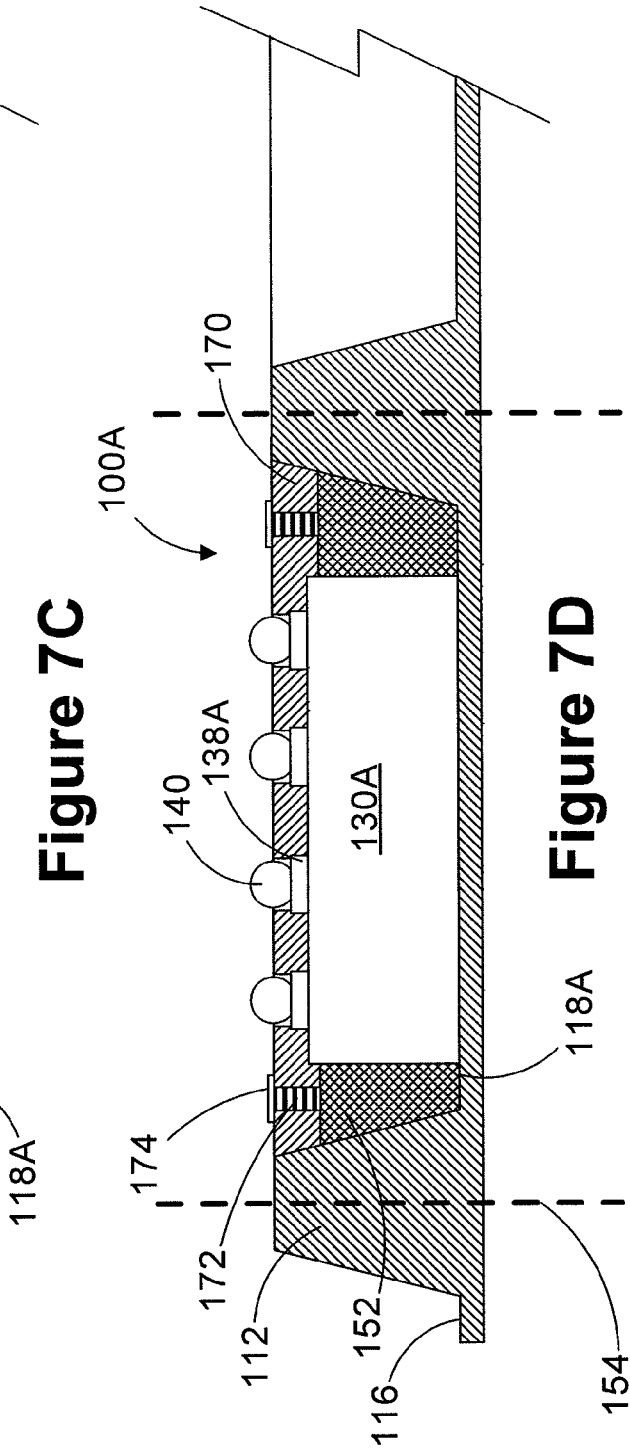

METHODS OF PACKAGING IMAGER DEVICES AND OPTICS MODULES, AND RESULTING ASSEMBLIES

CROSS-REFERENCE TO RELATED APPLICATION

This application is a divisional of U.S. application Ser. No. 11/958,757 filed Dec. 18, 2007, now U.S. Pat. No. 8,110,884, which is incorporated herein by reference in its entirety.

BACKGROUND

1. Technical Field

The present subject matter is generally directed to the field of microelectronic imager devices and methods of packaging imager devices and optics modules, and the resulting assemblies.

2. Description of the Related Art

Microelectronic imagers are used in digital cameras, wireless devices with picture capabilities, and many other applications. Cell phones and Personal Digital Assistants (PDAs), for example, are incorporating microelectronic imagers for capturing and sending pictures. The growth rate of microelectronic imagers has been steadily increasing as they become smaller and produce better images with higher pixel counts.

Microelectronic imagers include image sensors that use Charged Coupled Device (CCD) systems, Complementary Metal-Oxide Semiconductor (CMOS) systems, or other systems. CCD image sensors have been widely used in digital cameras and other applications. CMOS image sensors are also quickly becoming very popular because of their relative lower production costs, higher yields and smaller sizes. CMOS image sensors can provide these advantages because they are manufactured using technology and equipment developed for fabricating semiconductor devices. CMOS image sensors, as well as CCD image sensors, are accordingly "packaged" to protect the delicate components and to provide external electrical contacts.

FIG. 1 is a schematic view of a conventional microelectronic imager 1 with a conventional package. The imager 1 includes a die 10, an interposer 20 attached to the die 10 and a housing 30 attached to the interposer 20. The housing 30 surrounds the periphery of the die 10 and has an opening 32. The imager 1 also includes a transparent cover 40 over the die 10.

The die 10 includes an array of image sensors 12 and a plurality of bond pads 14 that are electrically coupled to the array of image sensors 12. The interposer 20 is typically a dielectric fixture having a plurality of bond pads 22, a plurality of ball pads 24 and traces 26 electrically coupling bond pads 22 to corresponding ball pads 24. The ball pads 24 are arranged in an array for surface mounting the imager 1 to a printed circuit board or module of another device. The bond pads 14 on the die 10 are electrically coupled to the bond pads 22 on the interposer 20 by wire bonds 28 to provide electrical pathways between the bond pads 14 and the ball pads 24. The interposer 20 can also be a lead frame or ceramic housing.

The imager 1 shown in FIG. 1 also has an optics unit including a support 50 attached to the housing 30 and a barrel 60 adjustably attached to the support 50. The support 50 can include internal threads 52, and the barrel 60 can include external threads 62 engaged with the threads 52. The optics unit also includes a lens 70 carried by the barrel 60.

One problem with packaging conventional microelectronic imagers is that it is difficult to accurately align the lens with the image sensor. Referring to FIG. 1, the centerline of the lens 70 should be aligned with the centerline of the image sensor 12 within very tight tolerances. For example, as microelectronic imagers have higher pixel counts and smaller sizes, the centerline of the lens 70 is often required to be within 50 microns of the centerline of the image sensor 12. This is difficult to achieve with conventional imagers because the support 50 may not be positioned accurately on the housing 30, and the barrel 60 is manually threaded onto the support 50. Therefore, there is a need to align lenses with image sensors with greater precision in more sophisticated generations of microelectronic imagers.

Another problem of packaging conventional microelectronic imagers is that positioning the lens 70 at a desired focus distance from the image sensor is time-consuming and may be inaccurate. The lens 70 shown in FIG. 1 is spaced apart from the image sensor 12 at a desired distance by rotating the barrel 60 (arrow R) to adjust the elevation (arrow E) of the lens 70 relative to the image sensor 12. In practice, an operator rotates the barrel 60 by hand while watching an output of the imager 1 on a display until the picture is focused based on the operator's subjective evaluation. The operator then adheres the barrel 60 to the support 50 to secure the lens 70 in a position where it is spaced apart from the image sensor 12 by a suitable focus distance. This process is problematic because it is exceptionally time-consuming and subject to operator errors.

Yet another concern of conventional microelectronic imagers is the manufacturing costs for packaging the dies. The imager 1 shown in FIG. 1 is relatively expensive because manually adjusting the lens 70 relative to the image sensor 12 is very inefficient and subject to error. Moreover, the support 50 and barrel 60 are assembled separately for each die 10 individually after the dies have been singulated from a wafer and attached to the interposer substrate 20.

Another problem with the traditional packaging arrangement depicted in FIG. 1 is the overall size of the packaged imager 1 is greater than would otherwise be desirable. Imager devices find application in many modern consumer electronic devices, e.g., cell phones, digital cameras, etc., wherein there is a constant drive to reduce the overall size of such consumer electronic devices. Reducing the overall size of such imager devices will facilitate producing smaller consumer electronic devices that contain such imager devices. Therefore, there is a significant need to enhance the efficiency, reliability and precision of packaging microelectronic imagers.

The present subject matter is directed to a device and various methods that may solve, or at least reduce, some or all of the aforementioned problems.

BRIEF DESCRIPTION OF THE DRAWINGS

The subject matter disclosed herein may be understood by reference to the following description taken in conjunction with the accompanying drawings, in which like reference numerals identify like elements, and in which:

FIGS. 4A-4E depict one illustrative process flow described herein;

FIG. 5 schematically depicts one illustrative optics module that may be employed as described herein;

FIG. 6 is a partial cross-sectional view of other embodiments of the invention that may be utilized as described herein; and FIGS. 7A-7E depict another illustrative process flow described herein.

Figure 1:
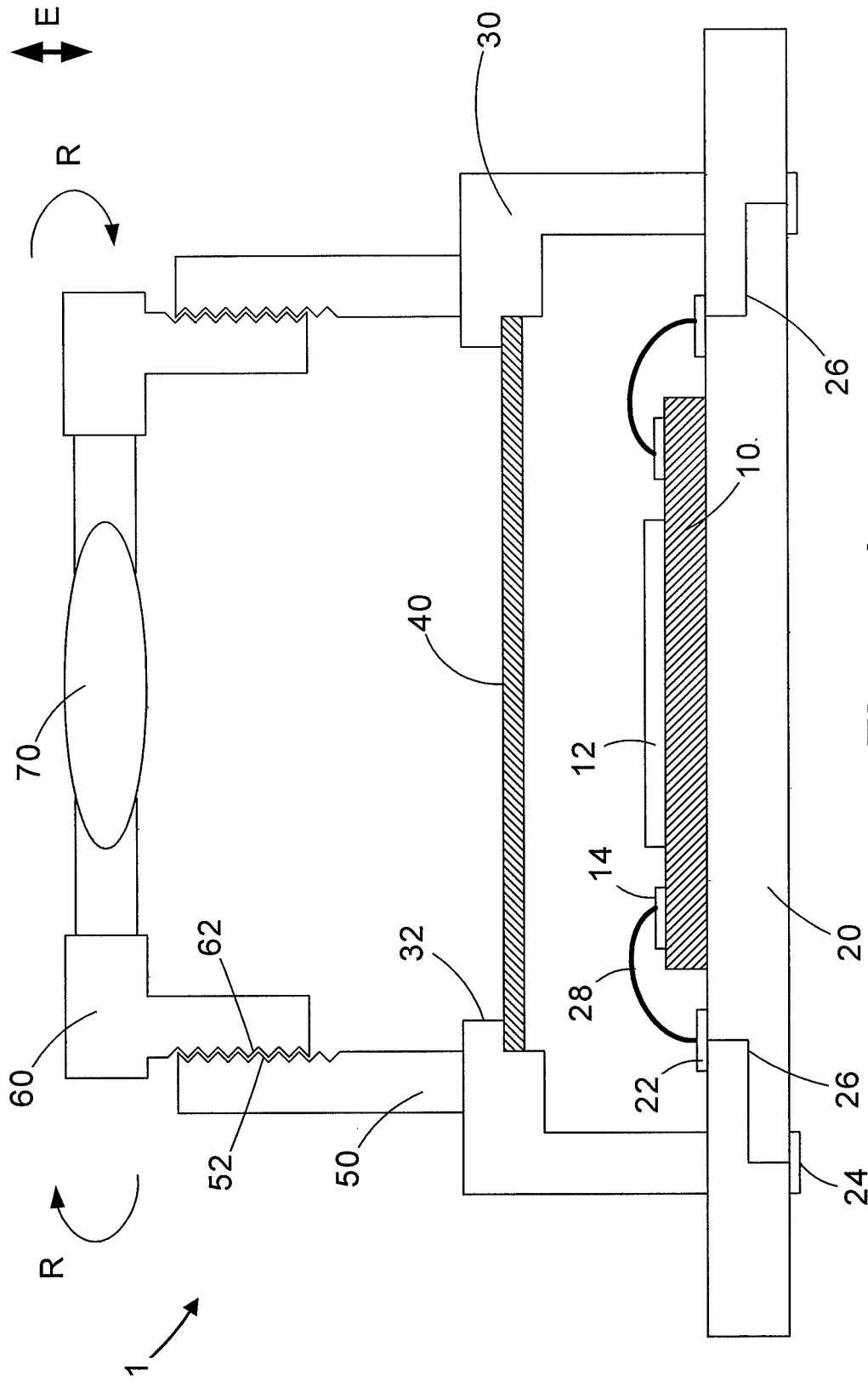
FIG. 1 is a schematic depiction of an illustrative prior art imager device.

While the subject matter described herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Illustrative embodiments of the present subject matter are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Although various regions and structures shown in the drawings are depicted as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the subject matter disclosed herein.

Figure 2A:
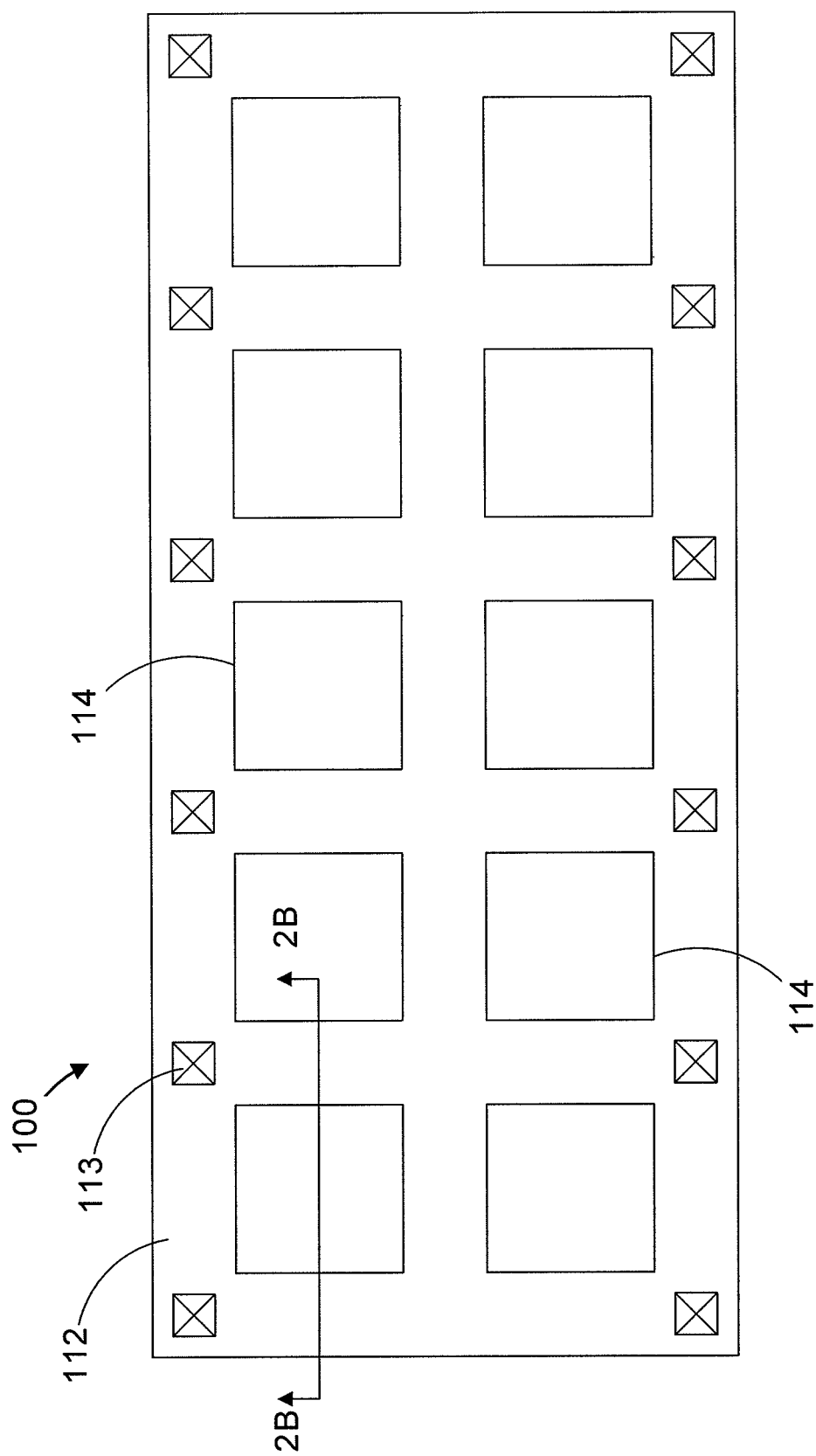
FIGS. 2A and 2B are various views of embodiments of the invention that may be utilized as described herein.
Figure 2B:
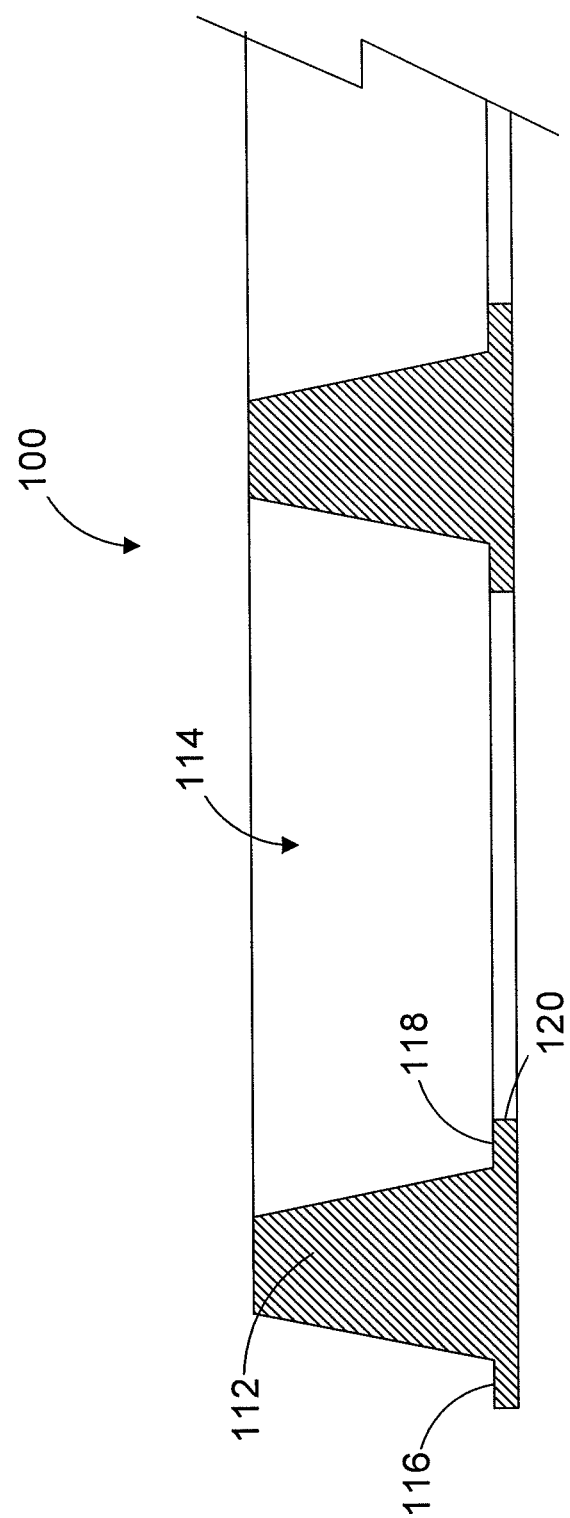

FIGS. 2A and 2B are, respectively, a schematically depicted plan view and a cross-sectional view of an illustrative imager carrier 100 that may be utilized as described herein. In the depicted embodiment, the carrier 100 comprises a molded body 112 and a plurality of openings 114 that extend through the body 112. The carrier 100 further comprises a plurality of schematically depicted alignment marks 113 embedded in the body 112. The alignment marks 113 are sometimes referred to in the art as fiducials.

As shown in FIG. 2B, the carrier 100 comprises an outer flange 116 (not shown in FIG. 2A) that extends around the perimeter of the carrier 100. The flange 116, if present, may be employed to transfer the carrier 100 on a rail-based handling system within a packaging facility. In the illustrative example depicted in FIG. 2B, a mounting flange 118 is provided around the perimeter of the lower opening 120 formed in the body 112.

As will be recognized by those skilled in the art after a complete reading of the present application, the carrier 100 and the opening 114 may be of any desired configuration, shape or size. Moreover, any number of openings 114 may be provided in the carrier 100. In some applications, the carrier 100 need not have any holes or openings that extend through the body of the carrier 100. The carrier 100 may be made from a variety of materials using a variety of known techniques. For example, the carrier 100 may be made of a traditional encapsulant material, e.g., mold compound, and it may be formed using traditional transfer molding techniques.

Figure 3:
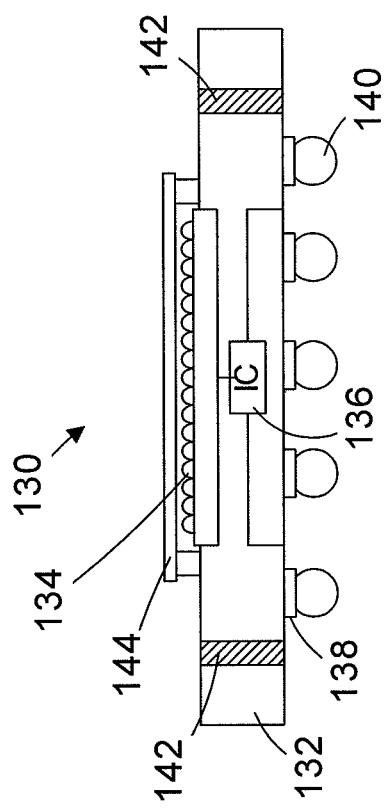
FIG. 3 schematically depicts an illustrative imager device that may be employed as described herein.

FIG. 3 is a schematic depiction of an illustrative imager device 130 that may be employed as described herein. The imager device 130 may be of any known construction. The imager device 130 typically comprises an array of photosensitive elements 134, internal circuitry 136 a plurality of bond pads 138 and a plurality of solder balls 140. The solder balls 140 are adapted to be electrically coupled to another structure, such as a printed circuit board (not shown in FIG. 3). The imager device 130 is formed above a substrate 132. The imager substrate 132 may be any of a variety of materials, e.g., silicon, silicon germanium, an SOI structure, etc. A plurality of conductive members 142 extend through the substrate 132. The imager device 130 depicted in FIG. 3 is intended to be representative of any type of integrated circuit device that employs any type of photosensitive elements. In one illustrative embodiment, the imager device 130 is a CMOS imager device.

FIGS. 4A-4E depict one illustrative method disclosed herein that involves mounting an imager device 130 within each of the openings 114 in the carrier 100. As will be understood by one skilled in the art after a complete reading of the present application, the imager device 130 may be of any desired shape, size and configuration. Moreover, the imager device 130 may be at any of a variety of different stages of manufacture when it is positioned in the opening 114 of the carrier 100. In the illustrative example depicted in FIG. 3, a plurality of solder balls 140 are depicted as being formed on the imager device 130 prior to positioning the imager device in the opening 114. However, the solder balls 140, or other conductively coupling means, may be formed on the imager device 130 after it is positioned in the openings 114 in the carrier 100. Similarly, a protective transparent cover 144 may be provided for the imager device 130 before or after it is positioned in the openings 114 in the carrier 100. Thus, the particular stage of manufacture of the imager device 130 should not be understood to be a limitation of the present invention. Moreover, when the term imager device is employed in the claims, it is to be understood that the term represents an imager device at any stage of fabrication. In some applications, it may be desirable to completely assemble the imager device 130 prior to positioning it in the carrier 100. For ease of explanation, the imager device 130 will be assumed to be a completely fabricated imager device.

As shown in FIG. 4A, the imager device 130 is positioned and secured in the opening 114 of the carrier 100. The imager device 130 may be secured within the opening 114 using any of a variety of known techniques. In the illustrative example depicted herein, the imager device 130 is secured to the mounting flanges 118 by an adhesive or epoxy material.

Next, as shown in FIG. 4B, an optics module 150 is positioned above and secured to the imager device 130. In the depicted embodiment, the optics module 150 may be secured to the substrate 132 by an adhesive or epoxy material. The optics module comprises one or more optical components that will be used in focusing light on the photosensitive elements 114 of the imager device 130. The optics module 150 may comprise one or more of a variety of optical devices, e.g., lenses, apertures, etc. The exact structure of the optic devices within the module 150 may vary depending upon the particular application. In some embodiments, the optics module 150 may be attached to the imager device 130 prior to positioning and securing that combination of components into the openings 114 in the carrier 100.

The optics module 150 is intended to be representative of any type of optical module that may be employed with imager devices 130. The optics module 150 may be a pre-packaged module of optical components or it may be a manufactured component. FIG. 5 schematically depicts one illustrative example of the optics module 150. As shown therein, the optics module 150 generally comprises a housing 150a that contains a plurality of schematically depicted lenses 150b, each of which is attached to a support member 150c. The illustrative optics module 150 further comprises a top opening 150d and a bottom opening 150e. The openings 150d, 150e are provided with a transparent cover 150f, e.g., glass, to permit light to pass through the optics s module 150 and irradiate the photosensitive elements 134. The lenses 150b are fixed in position within the housing 150a. Thus, once the optics module 150 is fixed or coupled to the imager device 130, the spacing between the optical components within the optics module 150 and the photosensitive elements 134 is fixed. This is in contrast to the optics position off the imager 1 depicted in FIG. 1 wherein the focus distance of the lens 70 relative to the photosensitive image sensors 12 is adjustable by means of rotating the barrel 60. Simply put, in one embodiment, the vertical spacing or distance between the optical components in the optics module is not adjustable once the optics module 150 is coupled to the imager device 130. Through use of the present methods, the focus distances of the lens 150b may be set at the factory under very precisely controlled conditions, and eliminate the need for consumer electronics device manufacturers to focus the optics portion of an imager device prior to putting the device in a consumer electronics device.

Returning back to FIG. 4C, after the optics module 150 is attached, the remaining portion of the opening 114 is filled with an encapsulant material 152. In general, any type of encapsulant material 152 may be employed with the methods and devices disclosed herein. In some applications, e.g., where electromagnetic shielding may be required or desired, the encapsulant material 152 may be an electrically conductive encapsulant material. Such electrically conductive encapsulant materials are readily available on the market. In one illustrative embodiment, the electrically conductive encapsulant material may comprise silver or some other electrically conductive material. When an electrically conductive encapsulant material 152 is employed, it is electrically coupled to the conductive members 142 that extend through the substrate 132 of the imager device 130. The conductive members 142 are electrically coupled to one or more of the bond pad 138/solder balls 140 on the imager device 130. Thus, the electrically conductive encapsulant material 152 may be electrically grounded when the imager device 130 is coupled to another structure, such as a motherboard.

Figure 4C:
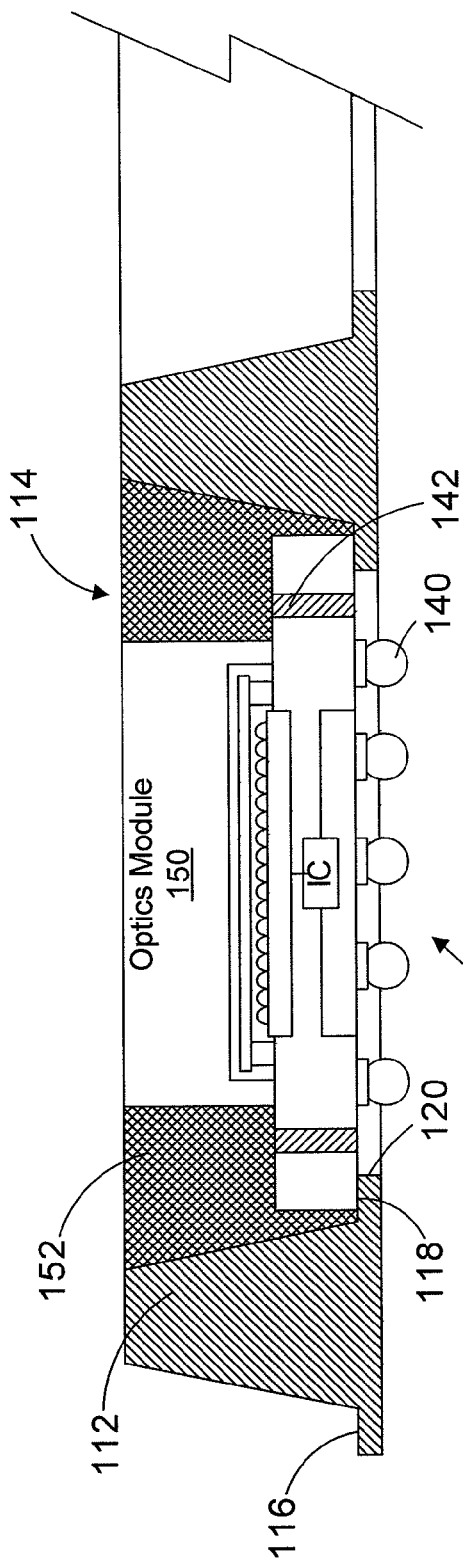
Figure 4D:
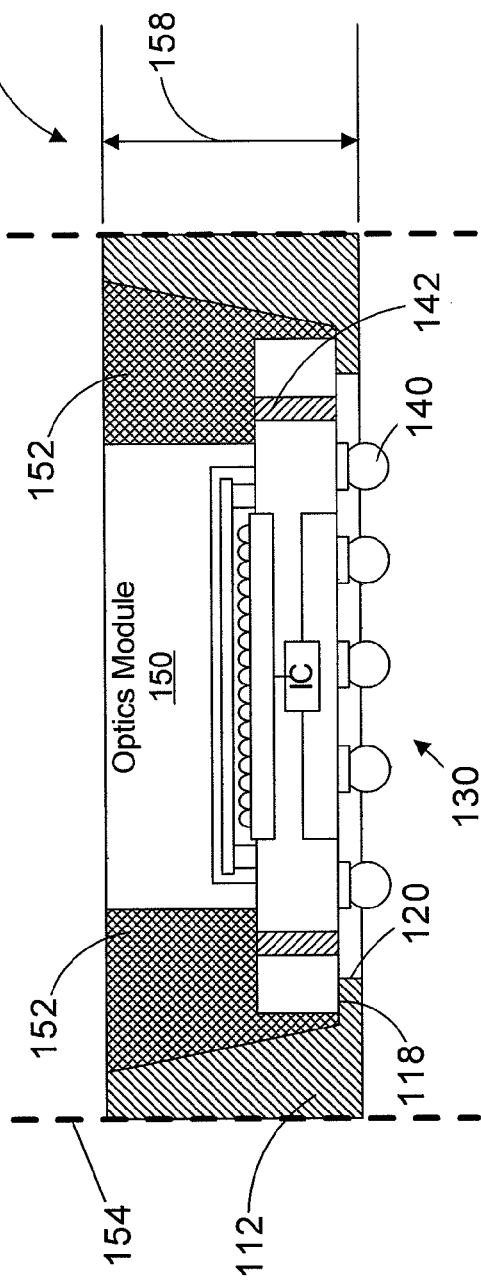

Next, as shown in FIG. 4D, a singulation process is performed to singulate the imager devices 130/optics module 150 units from the carrier 100, i.e., to form individual units that comprise at least an imager device 130 and an optics module 150. More specifically, in one embodiment, the carrier 100 is cut along cut lines 54 such that portions of the body 112 of the carrier 100 remain with the finished device 200.

Figure 4E:
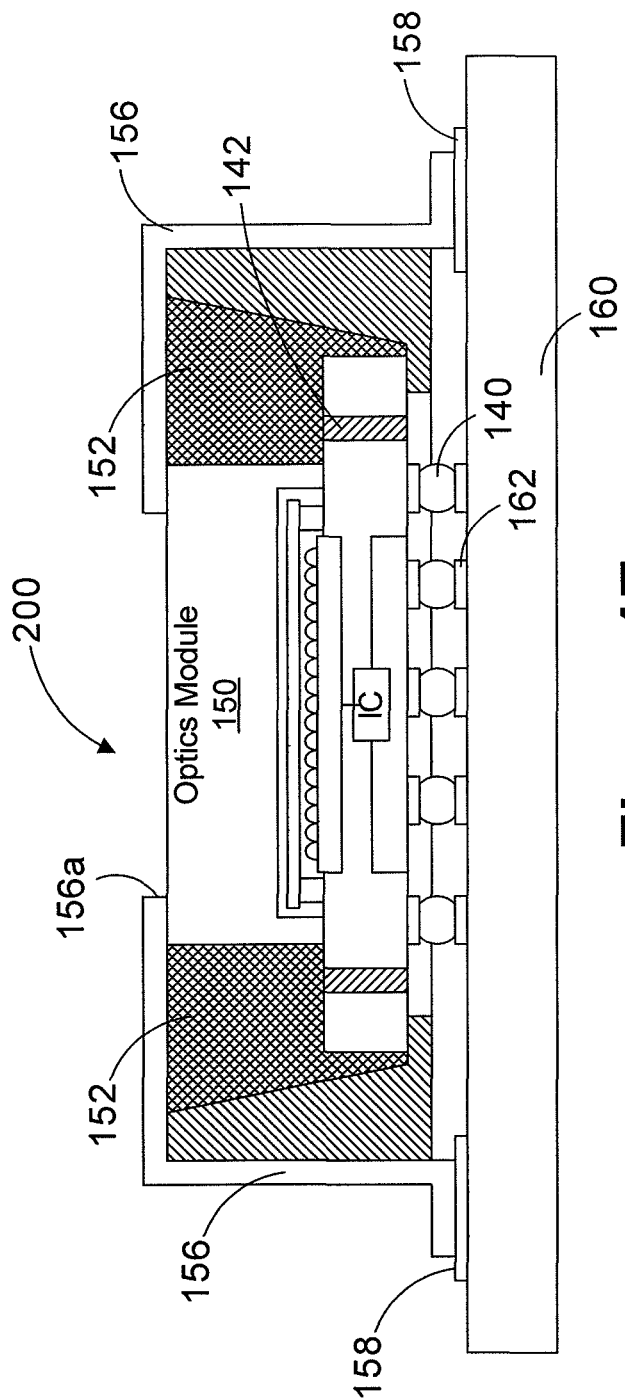

Ultimately, as shown in FIG. 4E, the completed device 200 may be operatively coupled to an illustrative printed circuit board 160, e.g., a motherboard of a cell phone. The solder balls 140 are conductively coupled to a plurality of contact pads 162 on the printed circuit board 160 by performing a reflow process. Additionally, in some applications, it may be desirable to add an external electromagnetic shield 156 to the device 200. For example, in cases where the encapsulant material 152 is not an electrically conductive material, the external shield 156 may be employed. The external shield 156 has an opening 156a that permits the passage of light to the underlying device 130. The external shield 156 may be made of any type of conductive material that is appropriate for shielding the device 130 from undesirable electromagnetic radiation, e.g., a metal. The external shield 156 may be electrically coupled to the printed circuit board 160 by a plurality of bond pads 158, thereby providing a means for electrically grounding the external shield 156.

In the previous discussion, the manner in which an illustrative imager device 130 and optics unit 150 may be packaged using the carrier 100 has been described. However, after a complete reading of the present application, those skilled in the art will appreciate that the concepts described herein may be employed in packaging a variety of different integrated circuit devices, e.g., microprocessors, memory devices, application specific integrated circuits, etc. FIGS. 6 and 7A-7E depict the packaging of a schematically depicted integrated circuit die 130A. The integrated circuit die 130A is intended to be generic in nature as it represents any type of integrated circuit device, such as those mentioned previously. The die 130A comprises a plurality of illustrative contact pads 138A.

Figure 7E:
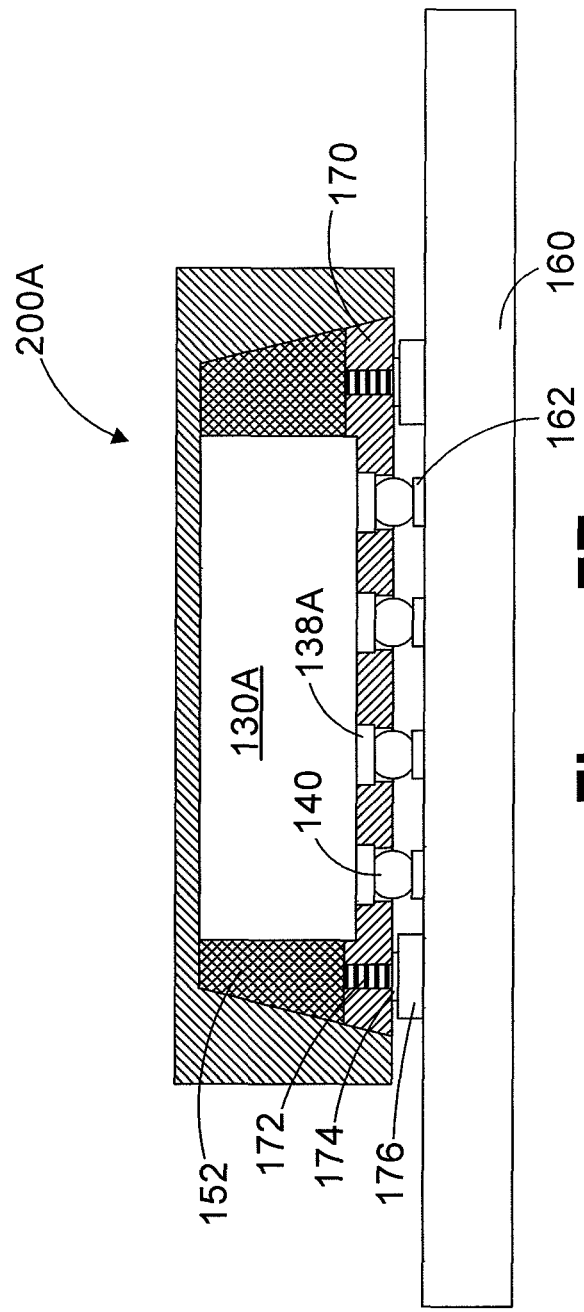

The examples depicted in FIGS. 6 and 7A-7E involve use of a modified carrier 100A that has a solid bottom surface 118A, as shown in FIG. 6. One illustrative process flow involve use of the carrier 100A is depicted in FIGS. 7A-7E. As shown in FIG. 7A, an illustrative integrated circuit die 130A is positioned within one of the openings 114A of the carrier 100A. The die 130A may be secured to the surface 118A using a variety of known techniques, e.g., an adhesive material, an epoxy, etc. Thereafter, the previously described encapsulant material 152 is positioned in the opening 114A between the die 130A and the body 112. In one example, the upper surface 152A of the encapsulant material 152 is below the surface 137 of the die 130A. As before, the encapsulant material 152 may be positioned within the openings 114A using traditional techniques. In applications where the encapsulant material 152 is non-conductive, the encapsulant material 152 may completely fill the opening 114A. For purposes of discussion, the remaining disclosure will be based on the assumption that the conductive material 152 depicted in FIG. 7B is an electrically conductive material.

Next, as shown in FIG. 7B, a layer of insulating material 170 is formed within the remaining portion of the opening 114A. A planarization process may be performed to produce a substantially flat surface 170A. The insulating material 170 may be formed using known techniques. In one illustrative embodiment, the material 170 may be a non-conductive encapsulant material.

Then, as shown in FIG. 7C, a plurality of openings 179 are formed in the insulating layer 170 to expose the contact pads 138A. Solder balls 140 are thereafter formed on the exposed portions of the contact pads 138A using known techniques. Also depicted in FIG. 7C are a plurality of conductive vias 172 and contact pads 174 that provide an electrical connection to the illustrative conductive encapsulant material 152. In the case where a non-conductive encapsulant material 152 is employed, the conductive via 172 and contact 174 may not be required. The conductive via 172 and contact 174 may be formed by forming an opening 181 in the insulating layer 170, e.g., by performing an etching process, and thereafter filling the opening 181 with a conductive material.

Thereafter, as shown in FIG. 7D, a singulation process is performed to cut the carrier 100A along illustrative cut lines 154. FIG. 7E depicts the die 130A after it has been inverted and attached to the illustrative printed circuit board 160. Enlarged contact pads 176 may be provided on the printed circuit board 160 so that a conductive connection may be established with the contact pads 174. A conductive adhesive paste (not shown) may be provided between the pads 174 and 176.

In the illustrative arrangement depicted in FIG. 7E, the conductive encapsulant material 152 may be grounded via the conductive via 172 and the contacts 174, 176. If necessary or desired, an external shield 156 as shown in FIG. 4E (without the opening 156A) may also be positioned around the device 200A and attached to the printed circuit board 160 to provide additional shielding for the device 130A.

Through use of the methods disclosed herein, an efficient and economical method of packaging imager devices and generic integrated circuit devices may be accomplished. Moreover, the illustrative finished device 200 depicted in FIG. 4D may have an overall height 158 (excluding the projection of the solder balls 140) of approximately 2000-3000 μm. Such a relatively short vertical height facilitates the use of the devices 200 in modern consumer electronic devices. Additionally, using the techniques disclosed herein, the manufacture of the consumer electronic device, e.g., a cell phone, does not have to go through the process of adjusting the focus distance of the lens of the imager device, as described above with reference to FIG. 1, as the focus distance of the imager device 130 assembled as described herein is fixed and set at the factory where the device 200 is manufactured. All the consumer electronics vendor needs to do is conductively couple the finished device 200 to the motherboard of the consumer electronic device. Similarly, the finished device 200A depicted in FIG. 7E also simplifies assembly requirements and reduces general package size.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

We claim:

1. A method, comprising:
   positioning an integrated circuit die in each of a plurality of openings in a carrier body, wherein the integrated circuit die has a first surface facing a mounting surface of the carrier body and a second surface opposite the first surface;
   adhering the first surface of the integrated circuit die to the mounting surface of the carrier body using an adhesive between the first surface of the integrated circuit die and the mounting surface of the carrier body;
   introducing an encapsulant material into each of the openings in the carrier body such that the encapsulant material encases at least a portion of the second surface of the integrated circuit die and at least partially fills the opening above the second surface, wherein the encapsulant material is not between the first surface of the integrated circuit die and the mounting surface of the carrier body; and
   cutting the carrier body to singulate the plurality of integrated circuit die.

2. The method of claim 1, wherein the integrated circuit die is coupled to a bottom surface of the plurality of openings in the carrier body.

3. The method of claim 1, wherein each of the integrated circuit die comprises a portion of the carrier body positioned around the perimeter of the integrated circuit die with at least a portion of the encapsulant material being positioned between the integrated circuit die and the portion of the carrier body.

4. The method of claim 1, wherein the integrated circuit die comprises at least one of a microprocessor, a memory device and an application specific integrated circuit.

5. A method, comprising:
   positioning an integrated circuit die in each of a plurality of openings in a carrier body;
   introducing an encapsulant material into each of the openings in the carrier body;
   cutting the carrier body to singulate the plurality of integrated circuit die; and
   wherein the encapsulant material is an electrically conductive encapsulant material.

6. The method of claim 5, further comprising forming at least one conductive structure that is conductively coupled to the electrically conductive encapsulant material.

7. A method, comprising:
   positioning an imager device and an optics module in each of a plurality of openings in a carrier body, wherein the imager device has a first surface facing a mounting flange of the carrier body and a second surface facing the optics module;
   introducing an encapsulant material into each of the openings in the carrier body such that the encapsulant at least partially encases the second surface of the imager device facing the optics module and at least partially fills the opening between the optics module and the carrier body; and
   cutting the carrier body to singulate the plurality of imager devices and optics modules into individual units, each of which comprise an imager device and an optics module.

8. The method of claim 7, wherein the optics module is coupled to the imager device prior to positioning the imager device and the optics module in each of the plurality of openings in the carrier body.

9. The method of claim 7, wherein the imager device is secured in the opening prior to positioning the optics module in the opening.

10. The method of claim 7, wherein each of the individual units comprises a portion of the carrier body positioned around the perimeter of the individual unit.

11. The method of claim 7, further comprising attaching the optics module to the imager device, wherein the imager device comprises a plurality of photosensitive elements, and wherein the optics module comprises at least one lens that, when the optics module is attached to the imager device, is positioned a fixed, non-adjustable distance from the plurality of photosensitive elements.

12. A method, comprising:
   positioning an imager device and an optics module in each of a plurality of openings in a carrier body;
   introducing an encapsulant material into each of the openings in the carrier body; and
   cutting the carrier body to singulate the plurality of imager devices and optics modules into individual units, each of which comprise an imager device and an optics module; and
   wherein the encapsulant material is an electrically conductive encapsulant material.

13. The method of claim 12, wherein the electrically conductive encapsulant material is conductively coupled to a conductive member that extends through a substrate of the imager device.

* * * * *